United States Patent
Noda et al.

(10) Patent No.: US 8,664,588 B2
(45) Date of Patent: Mar. 4, 2014

(54) MASS SPECTROMETER

(75) Inventors: Hiroyuki Noda, Kokubunji (JP); Mitsuru Onuma, Tokyo (JP); Yoko Sato, Fuchu (JP); Koji Ishiguro, Hitachinaka (JP); Hidetoshi Morokuma, Hitachinaka (JP); Shigeo Otsuki, Kasama (JP); Nami Ibi, Tokyo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/368,549

(22) Filed: Feb. 8, 2012

(65) Prior Publication Data

US 2012/0248305 A1 Oct. 4, 2012

(30) Foreign Application Priority Data

Mar. 31, 2011 (JP) ................................. 2011-079623

(51) Int. Cl.
*H01J 49/00* (2006.01)

(52) U.S. Cl.
USPC ............................ 250/281; 250/288; 361/818

(58) Field of Classification Search
USPC ...................................................... 250/281
See application file for complete search history.

(56) References Cited

U.S. PATENT DOCUMENTS

| | | | | |
|---|---|---|---|---|
| 5,313,061 A | * | 5/1994 | Drew et al. | 250/281 |
| 5,574,625 A | * | 11/1996 | Ohgami et al. | 361/679.09 |
| 5,694,294 A | * | 12/1997 | Ohashi et al. | 361/679.48 |
| 8,194,400 B2 | * | 6/2012 | Horii | 361/679.08 |
| 8,196,479 B2 | * | 6/2012 | Ludwick et al. | 73/863.31 |
| 2003/0184733 A1 | | 10/2003 | Kameoka | |

FOREIGN PATENT DOCUMENTS

| | | |
|---|---|---|
| JP | 2003-527563 | 9/2003 |
| JP | 2003-294619 | 10/2003 |
| WO | 00/62054 | 10/2000 |

* cited by examiner

*Primary Examiner* — Phillip A Johnston
(74) *Attorney, Agent, or Firm* — Mattingly & Malur, PC

(57) ABSTRACT

In the spectrometer, heavy loads are arranged centrally inside a case having a height smaller than a width, and having a depth smaller than the height. The heavy loads include a vacuum chamber, a vacuum pump which evacuates the vacuum chamber, a sample introduction unit which introduces a sample to be measured and evaporates the sample, an ionization unit which ionizes the evaporated sample and provides it to the vacuum chamber, and an ion detection unit which is connected to the vacuum chamber. Circuit board storage units which store a plurality of circuit boards with a predetermined space therebetween are formed on both sides along a width direction of the case.

12 Claims, 6 Drawing Sheets

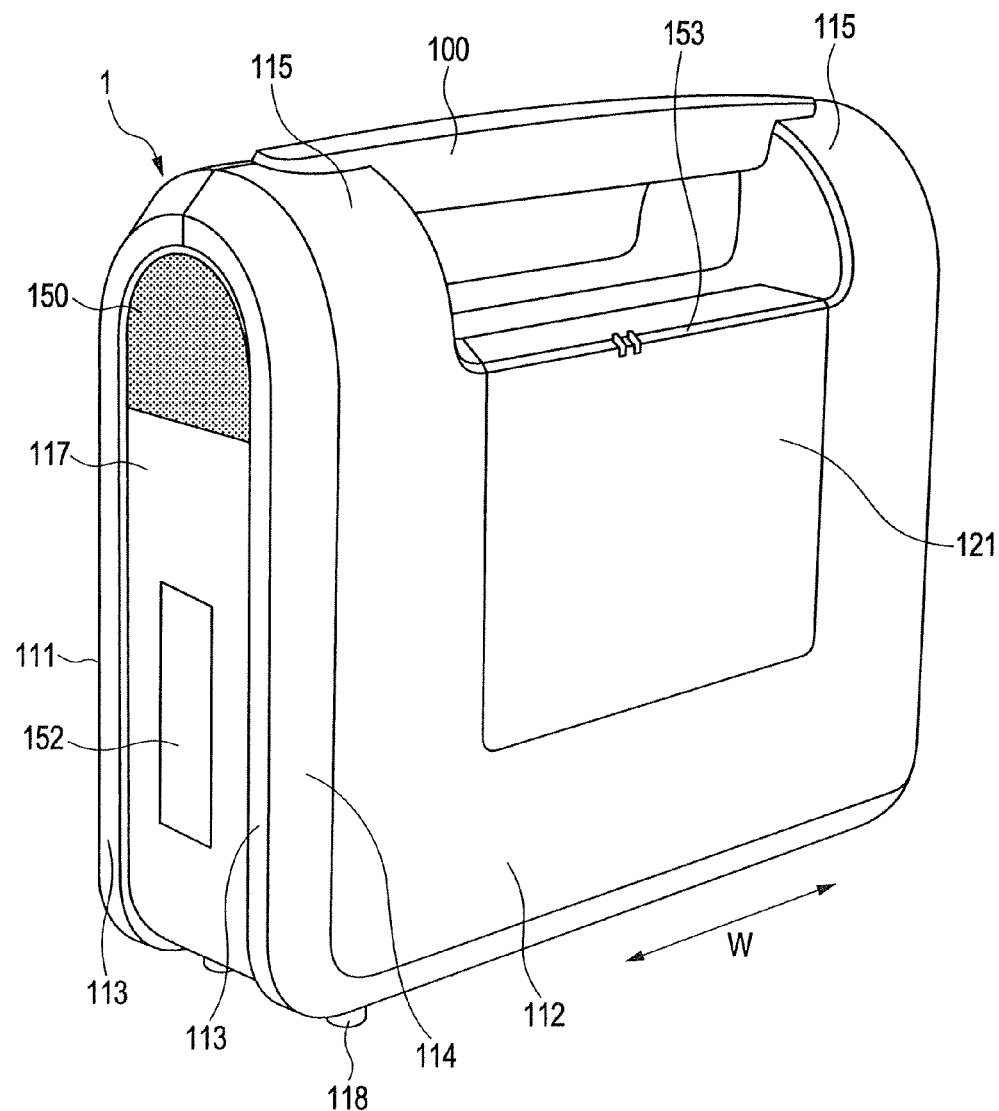

MASS SPECTROMETER

CLAIM OF PRIORITY

The present application claims priority from Japanese patent application JP 2011-079623 filed on Mar. 31, 2011, the content of which is hereby incorporated by reference into this application.

BACKGROUND OF THE INVENTION

1. Field of the Invention

The present invention relates to a small mass spectrometer.

2. Description of the Related Arts

Well-known mass spectrometers ionize a small volume of samples and electomagnetically separate the ions, thereby reliably measuring molecular weights. The mass spectrometry includes a liquid chromatography mass spectrometry and a chromatography mass spectrometry. The liquid chromatography mass spectrometry includes mass spectrometry after separating components of a target material to be analyzed in liquid chromatograph, while the chromatograph mass spectrometry includes qualitative analysis of the same component separated in gas chromatograph by performing the mass spectrometry measuring, so as to determine the quantitation of the components based on the intensity of the ion detected by the mass spectrometry.

In recent years, introduction of mass spectrometers has been demanded for the sake of safety, in some kinds of environments, such as the industry, the non-official entities, and military environment. This is because it is necessary to quickly determine the level or kind of contamination due to unknown chemical goods as quickly as possible.

Particularly, in some well-known cases, the introduction of the mass spectrometer has been demanded as a countermeasure for terrorism using chemical weapons (for example, poisonous gas) or for maintaining strict control of drugs. However, the conventional mass spectrometers are too large to be carried.

Some conventional techniques have been proposed. One technique (Japanese Patent Application Laid-Open Publication No. 2003-294619(hereinafter referred to as Patent Document 1)) proposes a portable compound analyzing system having a portable case containing at least an optical spectrometer and a mass spectrometer. Another technique (Japanese Unexamined Patent Application Publication No. 2003-527563 (hereinafter referred to as Patent Document 2)) proposes a gas chromatograph mass spectrometer whose entire weight including the entire vacuum system is light to be carried (approximately 25 kg).

SUMMARY OF THE INVENTION

The conventional technique discloses a method for improving the portability by storing internal implementation units inside a rectangular parallelepiped. However, such conventional techniques make no attention to the weight balance nor a problem about heat exhaustion at the implementation. This weight balance is an important matter to be considered in carriage.

For example, the first conventional example (Patent Document 1) has a layout in which entrances/exits respectively for an optical analyzing unit, a mass spectrometer, and an optical sound analyzing unit are about to face each other in adjacent positions, in consideration that the total length of the piping for conducting sample gas to each analyzing unit. Therefore, the disclosure contents make no attention to the weight balance, and do not disclose heat exhaustion.

The second conventional example (Patent Document 2) discloses a technique: for specifying various units included in the mass spectrometer; for setting the inside measurement of approximately 0.09 cubic meter; and for decreasing the inside measurement by having a suitable layout. However, no disclosure has been made to a basic layout or specific contents therefor and to heat exhaustion.

An object of the present invention is to provide a small size mass spectrometer which realizes excellent heat exhaustion efficiency and which is weight balanced in carriage.

In order to attain the above object, according to an aspect of the present invention, there is provided a mass spectrometer including a case and circuit board storage units which store plural circuit boards on both sides of the case, the case having heavy loads including a vacuum chamber, a vacuum pump which evacuates the vacuum chamber, an ion detection unit which is connected to the vacuum chamber, and a battery.

According to this invention, it is possible to provide a small mass spectrometer which realizes excellent heat exhaustion efficiency and good weight balance, because the weight balance is adjusted, by setting the circuit board storage units as exhaust passage, by centrally arranging the heavy loads, and by arranging two groups of light weighted boards on both sides thereof.

BRIEF DESCRIPTION OF THE DRAWINGS

FIG. 3 is an appearance diagram of the mass spectrometer when it is carried, according to the present invention;

DETAILED DESCRIPTION OF THE PREFERRED EMBODIMENTS

Figure 4:
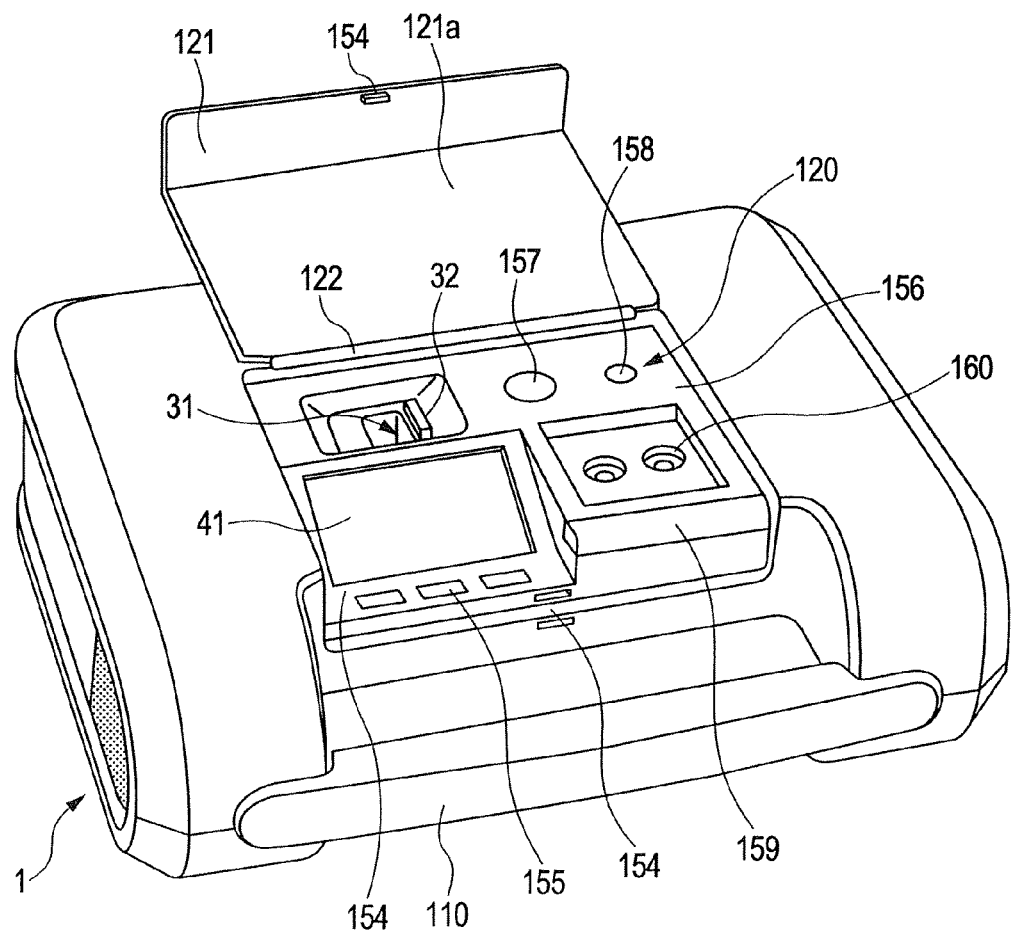
FIG. 4 is an appearance diagram of the mass spectrometer when it is used, according to the present invention.
Figure 5A:
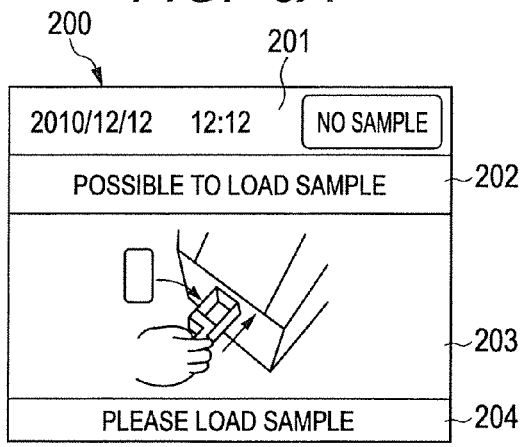
FIG. 5A to FIG. 5F are screen transition diagrams of the mass spectrometer according to the present invention.
Figure 5B:
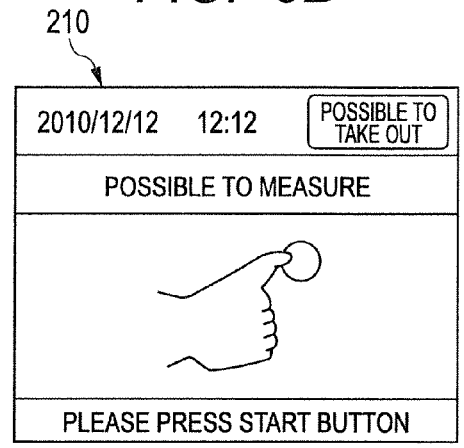
Figure 5C:
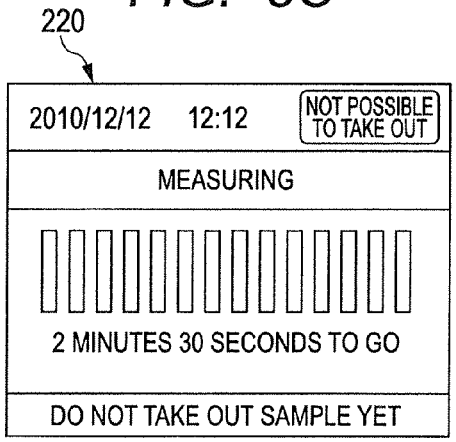
Figure 5D:
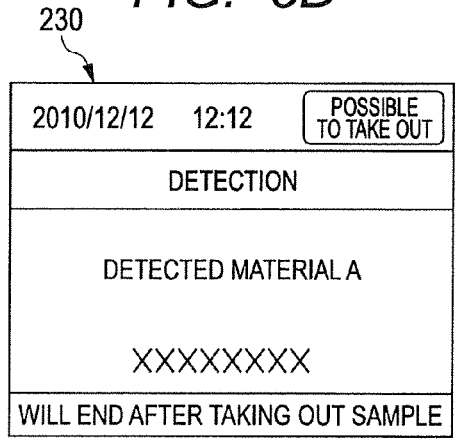
Figure 5E:
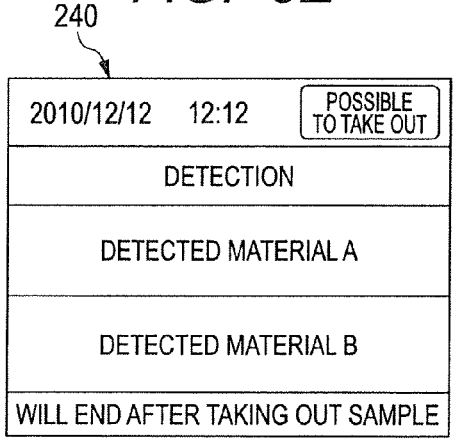
Figure 5F:
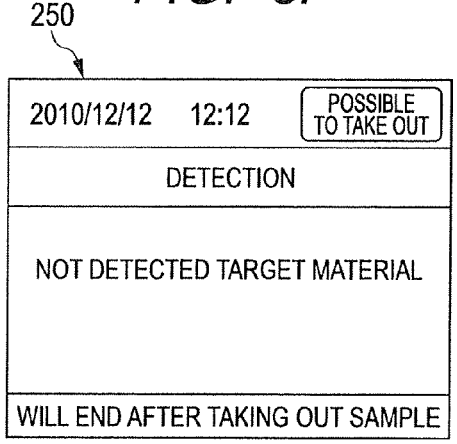
Figure 6A:
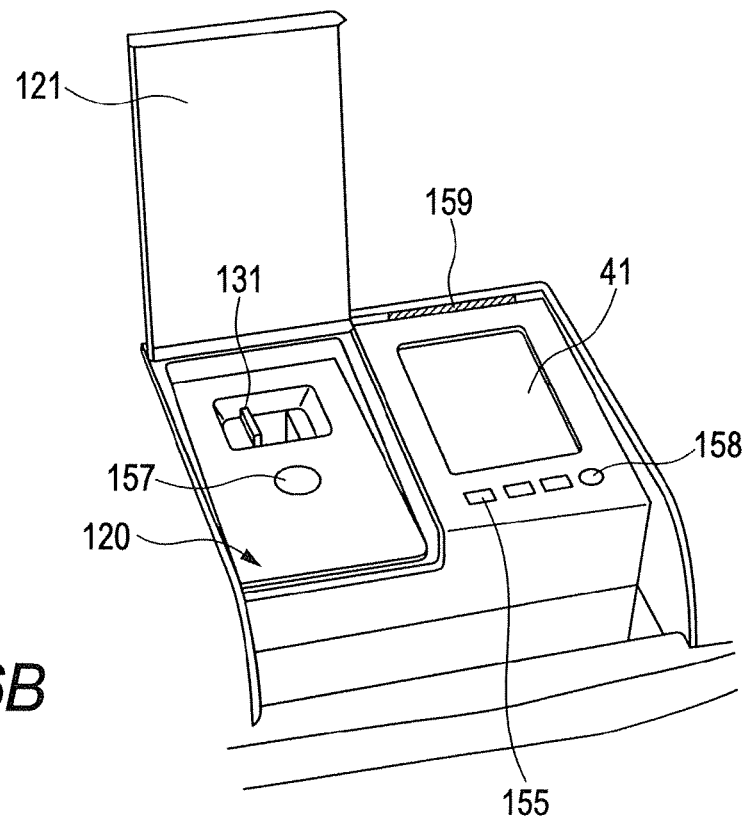
FIG. 6A is a diagram of a mass spectrometer according to another embodiment of the present invention.
Figure 6B:
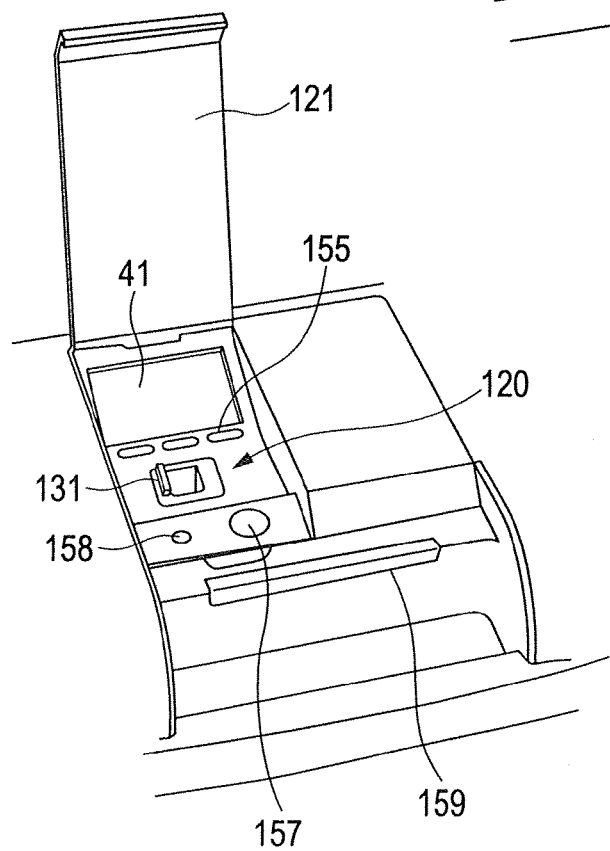
FIG. 6B is a diagram of the mass spectrometer according to another embodiment of the present invention.

Descriptions will now specifically be made to a mass spectrometer according to this invention, with reference to FIGS. 1A to 6B. FIGS. 1A to 5F illustrate the mass spectrometer according to a first embodiment, while FIGS. 6A and 6B illustrate a mass spectrometer according to another embodiment. In the descriptions below, the same components and arrows are identified by the same symbols, and will be described once.

First Embodiment

Figure 1A:
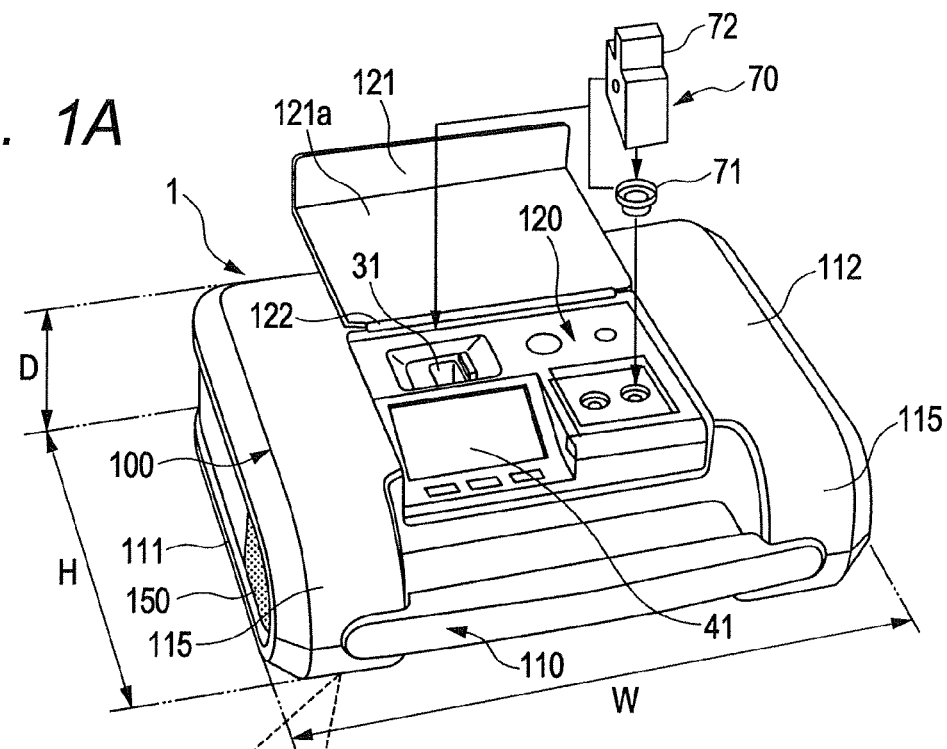
FIG. 1A is a schematic block diagram of a mass spectrometer according to the present invention.

The schematic configuration of the mass spectrometer according to this invention will now be described with reference to FIGS. 1A and 1B. FIG. 1A shows the appearance diagram of the mass spectrometer, while FIG. 1B shows the layout of the component parts inside the spectrometer.

Figure 1B:
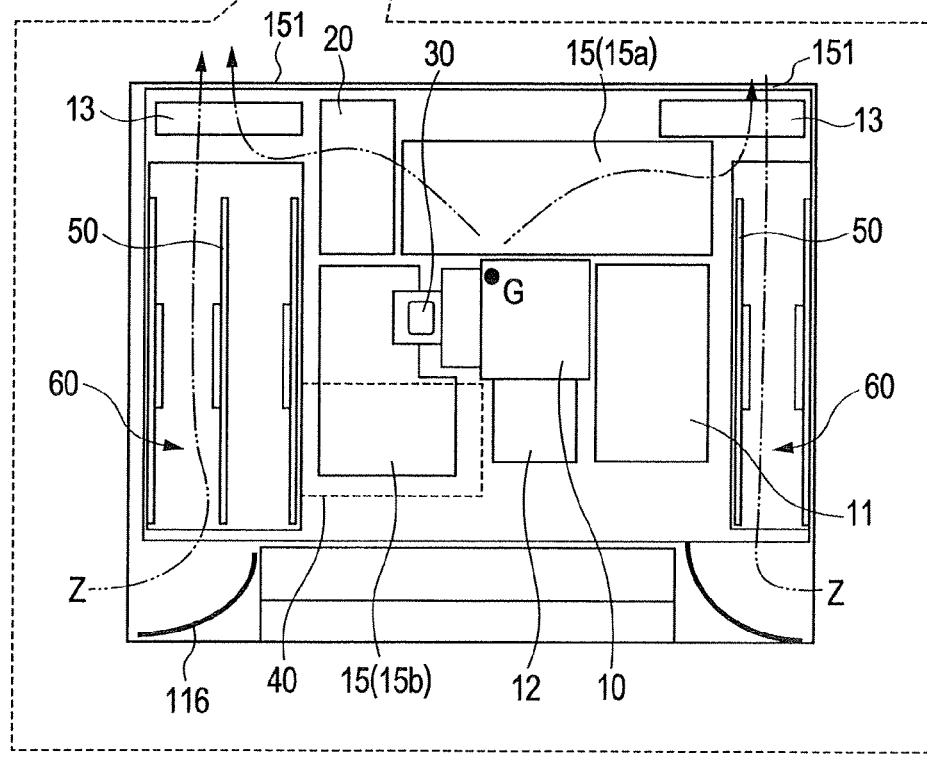
FIG. 1B is a schematic block diagram of the mass spectrometer according to the present invention.

In FIGS. 1A and 1B, the symbolical numeral 1 generally identifies the portable mass spectrometer which ionizes a small volume of sample and detects components of the sample by electromagnetically separating the ions.

This mass spectrometer 1 includes some mounted components, such as a vacuum chamber 10 and a vacuum pump 15, that are contained inside a box-type case 100. The appearance diagram of FIG. 1A shows a usage state (detection state) of the spectrometer which can be carried by a user holding a handle unit 110. The case 100 of this embodiment has a height H smaller than a width W, and has a depth D smaller than the height H. In addition, the case 100 has a size of a small bag, thus is excellent in carriage. That is, the user holding the handle unit 110 can carry the mass spectrometer 1 without a sense of discomfort.

As illustrated in FIG. 1A, at the usage, on this case 100, one wide surface 111 comes into contact with the installation surface, and an operation unit 120 is provided on the other wide surface 112 as the upper surface. This operation unit 120 is used for executing a detection operation. Thus, the user can use the securely installed mass spectrometer to perform the detection.

One major characteristic of the mass spectrometer of this embodiment is that the heavy loads, such as the vacuum chamber 10 and the vacuum pump 15, are arranged centrally inside the case 100, and plural circuit boards 50 are arranged on both right and left sides thereof.

In the example of FIG. 1B, three circuit boards are arranged on the left side of the illustration paper, while two circuit boards are arranged on the right side thereof.

That is, when the small size mass spectrometer 1 is carried, it is preferred that it be weight balanced. It is also preferred that the heavy loads be arranged near and right under the handle unit. For example, when to carry a bag having the heavy loads put aside to one side of the bag, this bag is not weight balanced, thus is not easily handled. In this case, a large moment is applied to the handle in carriage. This requires large power just to carry the bag.

The above problems are applicable to a bag having one single handle in the center of the top surface of the bag and also to a bag having handles on both sides thereof. That is, as a small size mass spectrometer, it is preferred that the spectrometer be weight balanced with the center of gravity near the center of the base 100.

In consideration of the above, inventors of the present invention paid their attention to a point that the mass spectrometer 1 needs plural circuit boards 50 and a point that the circuit boards 50 are used as a unit for improving the weight balance. The weight of the circuit boards 50 is very small in relation to their packaging space inside the case 100. On the contrary, the vacuum chamber 10, the vacuum pump 15, and a battery 20 are the heavy loads. Therefore, their arrangement has a great effect on the weight balance.

According to the given layout of this embodiment, the vacuum chamber 10 and the vacuum pump 15 are centrally arranged in the case 100, and the plural circuit boards 50 are arranged on both sides thereof.

In general, in relatively large bags (business case) that are carried with a single hand, the width W along the front and rear direction of the user when holding the bag with one single hand is greater than the height H along the vertical direction when holding the bag with one hand. This setting is made for not bothering about obstacle on the floor, in order that the width direction (width W) while walking coincides with the direction in which the user swings his/her arms as he/she walks, and in order to notice any obstacle on the front. Further, when holding the bag with one single hand, it is easy to hold the bag having the center of gravity right under the shoulder. Based on this, the width direction (depth W) of the user should be made thin so that the user can easily hold the bag. That is, it can be said that the portability can be maintained even if the width W is made large, in this type of one-hand-holding bag.

The inventors of the present invention have employed a layout in which the circuit boards 50 are arranged on both sides of the width W as the width direction, when holding the bag with one hand. Besides, the circuit boards 50 can easily be divided in the unit of several boards 50 and in the unit of functions. The plural separated circuit boards 50 can easily be arranged on both sides in consideration of the weight balance, thus capable of easily adjusting the center of gravity in the center of the case 100.

Another major characteristic of the mass spectrometer of this embodiment is that the heavy loads are arranged in the center of the case 100 round the vacuum chamber 10.

Figure 2A:
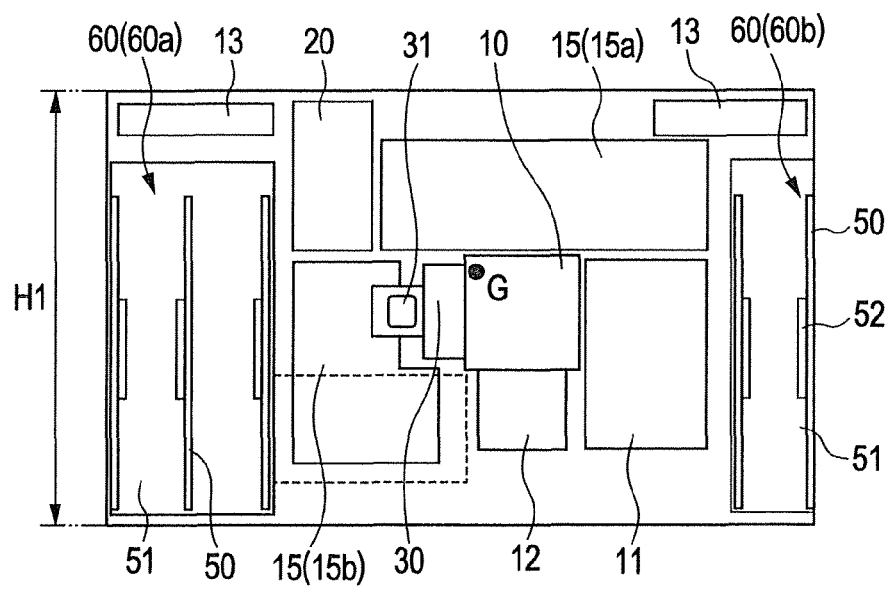
FIG. 2A is an internal layout diagram of the mass spectrometer according to the present invention.
Figure 2B:
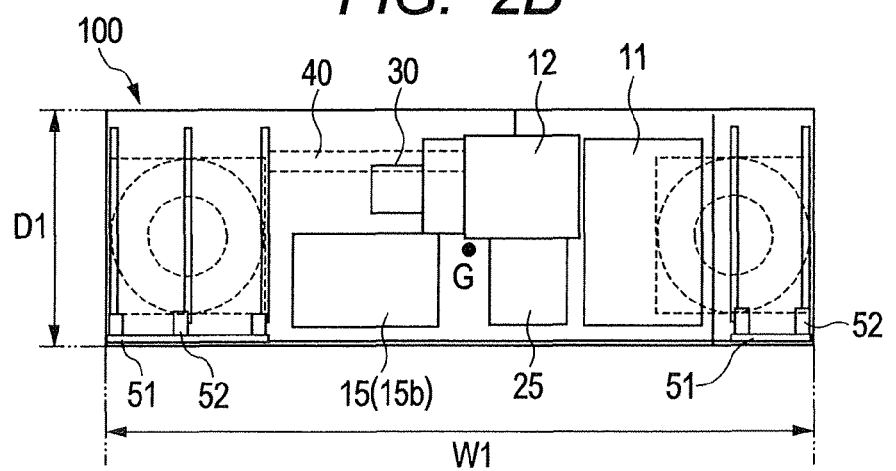
FIG. 2B is an internal layout diagram of the mass spectrometer according to the present invention.
Figure 2C:
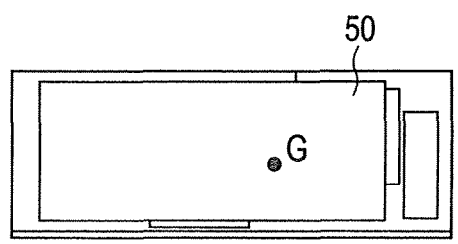
FIG. 2C is an internal layout diagram of the mass spectrometer according to the present invention.

That is, in the mass spectrometer 1, a sample insertion unit 30, the vacuum pump 15, and the ion detection unit 25 are connected to the vacuum chamber 10 (see FIGS. 2A to 2C). According to an employed layout of this embodiment, the vacuum chamber 10 is arranged in the center of the case 100, and various units are arranged therearound. In this configuration, the heavy loads can easily be arranged in the center of the case 100. Besides, the length of the electrical wiring can be made short, because the circuit boards 50 are arranged on both sides thereof.

In this embodiment, the vacuum chamber 10 is put aside to one wide surface 112 of the case 100, as its upper surface at the usage state shown in FIG. 1A. In addition, the sample insertion unit 30 and an RF oscillation circuit unit 11 are arranged to face each other, and a first vacuum pump (turbo pump) 15a and a vacuum gage unit 12 are arranged to face each other, on the side surface around the chamber. Further, the ion detection unit 25 (see FIGS. 2A to 2C) is arranged on the bottom surface. With this configuration, the sample insertion unit 30 connected to the vacuum chamber 10 can be arranged near the wide surface 112, thus easily attaching a sample insertion adapter 70 to the sample insertion unit 30.

Further, the weight balance is improved by arranging a heavy second pump (roughing vacuum pump) 15b on the opposite side of a heavy first vacuum pump 15a, through the vacuum chamber 10. A liquid crystal display unit 40 is arranged on the upper surface of the second vacuum pump 15b, and this liquid crystal display unit 40 is arranged adjacent to the sample insertion unit 30. As a result, an operation unit 120 including the sample insertion unit 30 and the liquid crystal display unit 40 is arranged on the upper wide surface 112.

Still another major characteristic of the mass spectrometer according to this embodiment is that the circuit boards 50 with high consumption power and generating heat are arranged near the right and left ends of the case, and circuit board storage units 60 on both sides thereof are exhaust heat passages.

That is, if each unit included in the mass spectrometer 1 is made compact, it is necessary to exhaust heat generated from each unit efficiently outside the case 100. In this embodiment, therefore, the circuit board storage units 60 are used as an exhaust heat passage of the circuit boards 50 arranged on both sides of the case 100. The circuit board storage units 60 as the exhaust heat passage are provided on both sides of the case 100. Thus, the heat generated by the circuit boards 50 can efficiently be exhausted using the two circuit board storage units 60. Because the circuit boards 50 are arranged along the exhaust passages, the heat generated by the circuit boards 50 is not conducted to the vacuum chamber or RF circuit, thus restraining the change in the performance of each unit due to temperature rise.

Still yet another major characteristic of the mass spectrometer 1 of this embodiment is that the circuit boards 50 provided in the circuit board storage units 60 are aligned along an exhaust passage direction Z.

That is, in this embodiment, in the configuration of the circuit boards 50, they are divided in the unit of several circuit boards 50 and arranged on both sides of the case 100, so as to improve the weight balance. However, the circuit boards 50 to be divided in the unit of several circuit boards needs to have certain sizes, otherwise the efficiency decreases. In this embodiment, one single circuit board 50 is rectangular, in which one side (long side) is equal to or smaller than the height H, another side (short side) is equal to or smaller than the depth D, and the thin thickness direction is parallel to the width direction W.

According to the arrangement of the circuit boards 50 in the circuit board storage units 60, one sheet of circuit board 50 can be made large, and each of the circuit board storage units 60 may be an aggregation of the plural circuit boards 50. In this case, each of the circuit board storage units 60 has spaces that are long along the height H and separated by the circuit boards 50. Therefore, in this embodiment, an exhaust passage along the exhaust passage direction Z (same as the height H) is formed inside the unit 60.

In this embodiment, to improve the exhaust efficiency, a blast fan 13 is arranged on one of the circuit board storage units 60 as the exhaust passage. In this embodiment, exhaust ports 150 are provided on both side surfaces of the case 100 as both sides of the handle unit 110, while an inlet port 151 is provided on the back surface side (bottom surface side) of the case 100 facing the handle unit 110.

Further major characteristic of the mass spectrometer 1 of this embodiment is the compact appearance structure in accordance with the internal configuration.

That is, in the appearance of the case 100 of this embodiment, both ends of the case 100 covering the circuit board storage unit 60 are projected in the forward direction, and the bar-like handle unit 110 is formed to connect the both ends of projecting units 115. According to this configuration, the bar-like handle unit 110 can be incorporated with the case 100 so as to enhance the strength.

In this embodiment, exhaust wind-direction plates 116 are provided inside the pair of projecting units 115, thereby refracting the exhaust. This avoids the exhaust from striking on the user. However, the present invention is not limited to the above configuration. For example, the space of the projecting units 115 may be used for storing attachments, or may be used as a packaging space for arranging the blast fan 13 or the circuit board 50. The directions of the exhaust passage direction Z may be changed by switching the exhaust port 150 and the inlet port 151 from one to the other.

Still further major characteristic of the mass spectrometer 1 of this embodiment is that an opening/closing cover 121 is provided on the operation unit 120, a non-illustrative manual is put on an internal surface 121a of the opening/closing cover, or the internal surface 121a is used as a storage space for the operation manual.

That is, the mass spectrometer 1 of this embodiment may frequently be carried outside. Thus, it is necessary to prevent dust from entering a sample insertion port 31 of the sample insertion unit 30 arranged inside the operation unit 120, and to prevent any attacks on a display screen 41 of the liquid crystal display unit 40. Hence, in the configuration of this embodiment, the operation unit 120 is covered with the opening/closing cover 121. This opening/closing cover 121 includes a hinge 122 on a side facing the handle unit 110, as illustrated in FIG. 1. At the usage state, the opening/closing cover 121 may turn backward.

According to this configuration, the opening/closing cover 121 may be used not only as a protection unit for the spectrometer, but also as an attachment space for the operation manual on the internal surface 121a.

Descriptions will now further be made to the mass spectrometer according to this embodiment with reference to FIGS. 1A to 5F. FIGS. 2A to 2C are internal layout diagrams of the mass spectrometer according to the present invention. In particular, FIG. 2A is a plane view of the mass spectrometer, FIG. 2B is a front view of the mass spectrometer, and FIG. 2C is a front view of the mass spectrometer. FIG. 3 is an appearance diagram of the mass spectrometer when it is carried. FIG. 4 is an appearance diagram of the mass spectrometer, at the usage. FIG. 5 are screen transmission diagrams of the mass spectrometer.

FIGS. 2A to 2C show the layout of the main constituent parts of the mass spectrometer according to this embodiment. In FIG. 2A, the handle unit 110 is arranged in the lower part of the illustration. The internal constituent parts are attached to a non-illustrative chassis.

According to the configuration of this embodiment, the internal constituent parts are covered with a resin-formed outer case. In this embodiment, descriptions will be made to a configuration in which the internal constituent parts are covered with an outer case including the handle unit 110. Instead of this outer case, the mass spectrometer may be carried while being stored in an attaché case including a hard case or may be stored in a soft (soft member) case including a handle part and a shoulder belt for holding the mass spectrometer contained in a box-type case.

In the descriptions of FIGS. 2A to 2C, to clarify the arrangement relationship of the units, the arrangement of each illustration will be described based on FIG. 2B, on the assumption that the upper part of the illustration corresponds to the upper surface of the spectrometer.

As described above, in this embodiment, the heavy loads are concentrated in the center of the case 100, and the circuit board storage units 60 including the circuit boards 50 are provided on both sides thereof. The main unit of the heavy loads is the vacuum chamber 10. This vacuum chamber 10 is arranged in the upper central part of the case 100.

In the plane view of FIG. 2A, the sample insertion unit 30 and the RF oscillation circuit 11 are arranged to face each other on both sides of the vacuum chamber 10. The vacuum gate unit 12 and the first vacuum pump 15a arranged to face each other in front and in rear of the vacuum chamber 10. As illustrated in FIG. 2B, an ion detection unit 25 is provided in the lower part of the vacuum chamber 10. Accordingly, in this embodiment, the units are arranged on the five surfaces of the vacuum chamber except the top surface thereof having approximately a rectangular parallelepiped, thus improving the accuracy and realizing the compact size of the mass spectrometer. Further, in this arrangement, because the sample insertion unit 30 to be attached to the vacuum chamber 10 is arranged near the upper surface of the mass spectrometer, the sample insertion port 31 of the sample insertion unit 30 is arranged near the upper surface so as to desirably attach/detach the sample insertion adapter 70 to/from the sample insertion port 31, as illustrated in FIG. 1A.

In this embodiment, the heaviest unit is the vacuum pump 15, and occupies one fourth of the entire weight. In this embodiment, the vacuum pump 15 includes two stages: that are a first vacuum pump (turbo molecular pump) 15a to be attached to the vacuum chamber 10 and a second vacuum pump (roughing pump) 15b to be attached to the first vacuum pump 15a.

In this embodiment, the second vacuum pump (roughing pump) 15b is arranged in the front part of the case 100. In particular, the second vacuum pump 15b is arranged to face the first vacuum pump 15a arranged in the rear part of the case 100. This attempts to obtain the weight balance of the case 100 along the front and rear direction.

The second vacuum pump 15b is arranged in the lower part of the case 100, thereby maintaining an arrangement space for the liquid crystal display unit 40 in the upper part thereof. As a result, the sample insertion port 31 of the sample insertion unit 30 is arranged near the liquid crystal display unit 40. Therefore, the operation unit 120 may be made compact.

Another heavy load may be a battery 20. In this embodiment, the battery 20 is arranged in the rear part of the case 100 in a position next to the first vacuum pump 15a in a side-by-side manner. By so doing, the center of gravity G will slightly be lowered approximately in the rear of the case 100, that is, in a carriage posture having the handle unit 110.

A backboard substrate 51 is provided on the bottom surface of the circuit board storage units 60 arranged on both sides of the case 100. Provided on this backboard substrate 51 are circuit board installation units 52 for aligning the circuit boards 50 in the front and rear direction. According to this configuration, the rectangular circuit boards 50 are put side by side respectively on the circuit board installation units 52, in the front and rear direction.

As described above, in this embodiment, the circuit boards 50 are processed as parts for adjusting the center of gravity G. Thus, the circuit board storage unit 60a on the left side stores a larger number of circuit boards 50 than the number of circuit boards 50 in the circuit board storage unit 60b on the right side, and has a larger storage space than that of the circuit board storage unit 60b. This is based on the weight and an amount of generated heat of each circuit board and an effect of electric noise.

In this embodiment, a circuit board for controlling electricity are digital circuit board and arranged in the circuit board storage unit 60a on the left side near the battery 20, while an analog circuit board having a high voltage is arranged in the circuit board storage unit 60b on the right side.

The above-described layout is applied to the mass spectrometer 1 according to this embodiment. As a result, the center of gravity G may be set approximately in the center along the right and left direction, approximately in the rear part along the front and rear direction, and approximately in the lower part of the vertical direction. With this center of gravity, the center of gravity G is approximately in a lower center position, thus enabling to realize the analyzing process in a stable posture. In the carriage posture in which the handle unit 110 is held with one hand, the center of gravity is the center and slightly in the lower part along the right and left direction of the case 100, thus enabling to realize the carriage operation. In a normal carriage posture, the spectrometer is held while the operation unit 120 is set in the nearest part to the outer periphery. In other words, the center of gravity may be set in a position near the user side, that is, in a position right below the shoulder of the bearer. Therefore, it is possible to easily carry the spectrometer.

In this embodiment, the blast fan 13 is provided in the rear parts on both sides of the circuit board storage units 60. However, it is not limited to this configuration. That is, the exhaust systems inside the case 100 include a system for pushing the outside air into the case 100 with the blast fan 13 and a system for taking out the heat inside the case 100 with the blast fan 13. In consideration of the weight balance, the blast fan 13 may adequately be arranged.

In this embodiment, because the laminar circuit boards 50 can be arranged separately on both sides of the circuit board storage units 60, the exhaust passage direction Z can be formed along the laminar circuit boards 50. The heat generated from each unit arranged in the center of the case 100 is taken into the circuit board storage units 60 on both sides so as to be exhausted, thus improving the heat exhaustion efficiency.

The external appearance of the mass spectrometer 1 according to this embodiment will be described with reference to FIGS. 3 to 4.

In FIG. 3, the mass spectrometer 1 according to this embodiment is made thin in the form of a business attaché case, and has a compact outer appearance without a bulky body to carry. In the periphery form of the handle unit 110 which is a matter of public exposure in carriage, the pair of projecting units 115 are rounded toward the head end. The projecting units 115 are formed continuously from the box-shaped end parts. The bar-like handle unit 110 is provided to connect the pair of projecting units 115. Accordingly, a simple configuration without a concave-convex surface is realized with the handle unit 110 introduced into the case 100. The bar-like handle unit 110 is supported by the pair of projecting units 115, thus making an appeal to user about the strong configuration.

As seen from the illustration, the outer appearance of the case 100 has a form covered with a thick cover body 113 connecting from the pair of rounded projecting units 115 to the pair of wide surfaces 111 and 112, with minimized concave-convex irregularities thereon, so as to be easily mounted into vehicles or the like. The periphery of the cover body 113 has corner parts 114 that are rounded, thus reducing the impression of the bulky body. With this appearance, the rain or dusts can easily be wiped out in carriage. Further, the side surface wall 115 of both sides along the width W is lower than the end part of the cover body 113 by one step. Inside that, the exhaust port 150 and an external terminal unit 152 are provided. Thus, the exhaust port 150 and the external terminal unit 152 are unlikely subject to external attacks.

The external terminal unit 152 is covered with the opening/closing cover, in which a non-illustrative main power switch or an external connection terminal is arranged. The external terminal unit 152 is provided adjacent to the circuit board storage unit 60. Thus, the main power switch or the external connection terminal is directly connected to the circuit boards 50 provided in the circuit board storage unit 60. Therefore, this configuration does not need new wiring.

In FIG. 3, the lower part of the case 100, as the bottom surface, has one down step so as to form a pair of side surface walls 117 in a continuous form, and includes four projecting leg parts 118 on the four corners. As a result, the case 100 can stably be put on the floor, thus preventing the entrance of water into the inlet port 151 formed on this bottom surface, when the case 100 is put on the floor.

Further, the wide surface 112 has the opening/closing cover 121 that is flat with respect to the surrounding wide surface 112, in a state where the cover 121 is closed as shown in FIG. 3. On this opening/closing cover 121, an indicator 153 for indicating "charge" or "power ON" is provided. This indicator 153 is not limited to be provided on the opening-closing cover 121, but may be provided on the case 100.

Descriptions will now be made to the operation unit 120 with reference to FIG. 4. In FIG. 4, the opening/closing cover 121 of this embodiment has an L-like shape in cross section, has the head end part bent toward the handle unit 110, and has an opening/closing mechanism 154 on its head end. With this configuration, the opening/closing mechanism 154 is the upper surface in posture of carriage shown in FIG. 3, thus preventing unintentional operation of the opening/closing mechanism 154. This minimizes the opening/closing cover 121 kept open in carriage.

In this embodiment, the opening/closing cover 121 is in an L-like form. The opening/closing mechanism 154 has an inclined surface, and includes the display screen 41 arranged thereon. With this configuration, it is possible to improve the visibility and operability of the display screen 41 arranged on the inclined surface (opening/closing cover 154) and a liquid crystal operation switch 155 arranged in the front part thereof.

In this embodiment, the inclining opening/closing cover 154 is formed on the left front side of the operation unit 120, and an operation surface 156 is formed along a horizontal surface at the back and right side thereof. A sample insertion port 31 is provided at the back and left side of the horizontal operation surface 156. An analysis start switch 157 and a sub-main power switch 158 are arranged side by side at the back and right side of the operation surface 156. A detection lamp 159 is arranged at the right forefront part of the operation surface 156.

The sample insertion port 31 has an attachment lever 32 for fixing the sample insertion adapter 70 shown in FIG. 1A. In this embodiment, on the spot of analysis, this sample insertion port 31, the analysis start switch 157, and the sub-main power switch 158 are simply operated so as to perform an analysis process. In this embodiment, visible parts, such as the display screen 41 and the detection lamp 159, are arranged in the front part of the operation unit 120, while operation parts, such as the sample insertion port 31, the analysis start switch 157, and the sub-main power switch 158 are arranged in the back part thereof. In this arrangement, the operation parts can be operated while checking the visible parts, or while acquiring the guidance about the visible parts.

In this embodiment, an adapter preparation unit 160 for preparing a sample insertion adapter 70 is provided using the space between the detection lamp 159 and the analysis start switch 157. As shown in FIG. 1A, the sample insertion adapter 70 includes a sample container 71 for putting sample pieces and an attachment case 72 for attaching this sample container 71 to the sample insertion unit 30.

With this adapter preparation unit 160, the sample container 70 having the sample put therein is set in a hollow part. The attachment case 72 can be attached downward from up into the stably set sample container 71. This coupled sample insertion adapter 70 can be attached to the sample insertion port 31.

The opening/closing cover 121 of this embodiment can be open backward through the hinge 122 which is provided in the rear part of the operation unit 120. Thus, the internal surface 121a of the opening/closing cover 121 is visible to the users. In this embodiment, non-illustrative guidance representing the operation procedures of the mass spectrometer 1 is illustrated on the internal surface 121a. In accordance with this guidance, easy operations can be achieved without reading an operations manual.

The use of and operational method of this mass spectrometer 1 will now be described with reference to FIGS. 1A, B and 5A to 5F.

In the mass spectrometer 1, a non-illustrative control circuit included in the circuit boards 50 generally controls the mass spectrometer 1. The mass spectrometer 1 is activated upon operation of a non-illustrative main power switch provided on the external terminal unit 152. Upon operation of the sub-main power switch 158, the control circuit starts to prepare the operations, and displays a screen 200 on the display screen 41, as shown in FIG. 5A

This screen 200 includes a confirmation display unit 201 in the uppermost row, a first status display unit 202 in the second row, a second status display unit 203 in the third row, and a guidance unit 204 in the lowest row. The confirmation display unit 201 shows the analysis date/time and a status of the sample insertion unit 30. The first status display unit 202 shows the status of examination step. The second status display unit 203 shows guidance additional information and the examination result. The guidance unit 204 shows the operations guidance in written form. No change will be made in the basic layout of the screen 200. This screen 200 has been described only by way of example, and is not limited to this.

The screen 200 of FIG. 5A shows the present time, and also shows that no sample has been set into the sample insertion port 30. The control circuit may display this screen 200, and also may output voice data stored in a memory unit provided in the circuit board 50, through a non-illustrative speaker. In this case, the output contents correspond to the guidance on the screen 200. For example, the user can confirm that the sample can be loaded now, and also that he/she is instructed to load the sample based on the guidance contents and the voice, by watching the screen 200. Now, the user can understand the operational method based on the guidance screen of the second status display unit 203.

Upon reception of the screen 200, the user can set the sample insertion adapter 70 (including the sample container 71 and the attachment case 72 as shown in FIG. 1A) to the sample insertion port 31, and executes an operation for fixing the adapter by operating the attachment lever 32.

The control circuit displays the screen 210 shown in FIG. 5B, upon detection that the sample insertion adapter 70 is set to the sample insertion port 31 by operation of the attachment lever 32 based on a non-illustrative sensor. This screen 210 shows the guidance that the sample insertion adapter 70 can be taken out now, informs that it is possible to perform measurement, and instructs the user to press the start button. In this status, the control circuit starts the analyzing when the analysis start switch 157 is operated.

The control circuit displays the screen 220 shown in FIG. 5C, when the analysis start switch 157 is operated. This screen 220 shows that the sample insertion adapter 70 cannot be taken out, and shows also the remaining detection time. Upon detection of one kind of target material, the control circuit displays the screen 230 shown in FIG. 5D. Upon detection of several kinds of target materials, the control circuit displays the screen 240 shown in FIG. 5E. When no target material has been detected, the circuit displays the screen 250 shown in FIG. 5F.

On the screens of FIGS. 5D and 5E, the control circuit outputs a voice signal for informing that the target material has been detected, or informs the user about the detection of the target material by flashing or turning on a specific light of light on the detection lamp 159. This specific color represents the detection of a target material. Similarly, if no target material has been detected, the control circuit outputs the same voice signal together with the screen of FIG. 5F, and turns on or flashes another specific color of light on the detection lamp 159.

In each of FIGS. 5D to 5F, the screen shows the guidance for instructing the user to take out the sample insertion adapter 70, upon complete examination. Then, the control circuit displays the screen 200 of FIG. 5A, when it is detected that the sample insertion adapter 70 has been taken out, upon user operation of the attachable lever 32.

Another Embodiment

Another layout of the operation unit will now be described with reference to FIGS. 6A and 6B.

FIG. 6A shows a layout of another embodiment, in which the operation unit 120 is divided into two parts left and right. One divided part includes the sample insertion port 31, which needs to be covered with the opening/closing cover 121, and sub-main power switch 157 related to this sample insertion port 31. The other divided part includes the display screen 41, the detection lamp 159, and the sub-main power switch 158. This embodiment is suitable when a large display screen 41 is applied. Even if the opening/closing cover is not open, the display screen is operable with using the liquid crystal operation switch 155. Therefore, unnecessary exposure of the sample insertion port and/or analysis start switch can be prevented, at the operations the maintenance or at the confirmation of analysis history.

In the embodiment of FIG. 6B, the analysis start switch 157 and the sub-main power switch 158 are arranged in the front part of the operation unit 120, while the sample insertion port 31 is arranged in the rear part of them, and further the display screen 41 is arranged compact in the rear part of that. This embodiment is suitable for the operation unit of a further compact mass spectrometer. The display screen may be arranged in the rear part of the sample insertion port. In other words, the screen is kept away from the user. In this arrangement, even if a solution is unexpectedly spilt when the sample insertion adapter 70 is inserted into the sample insertion port, the possibility that the spilt solution reaches the display screen may be reduced.

Accordingly, the mass spectrometer of this embodiment includes the case and circuit board storage units on both sides of the case. Inside the case, heavy loads are arranged in the center thereof, and include the vacuum chamber, the vacuum pump, the sample insertion unit, and the ion detection unit. Specifically, the vacuum pump evacuating air from the vacuum chamber. The sample insertion unit provides ionized sample into the vacuum chamber. The ion detection unit is connected to the vacuum chamber. Each of the circuit board storage units stores plural circuit boards.

In this case, the case has the height larger than its width and the depth smaller than the height. The above-described circuit board storage units are provided on both sides along the width direction. The plural boards arranged inside the circuit board storage units are aligned along the height direction. Further, each of the circuit board storage units includes exhaust/inlet ports at both terminal ends along the height direction.

In the mass spectrometer of this embodiment, a case has heavy loads including a vacuum chamber, a vacuum pump evacuating air from the vacuum chamber, a sample insertion unit for providing ionized sample into the vacuum chamber, and an ion detection unit connected to the vacuum chamber, in the center thereof. Exhaust passages for exhausting heat generated from the heavy loads are formed on both sides thereof, and plural circuit boards are separately stored along the exhaust passages.

In this case, the case has the height larger than the width, and has the depth smaller than the height. The exhaust passages are formed on both sides along the width direction. The plural boards arranged inside the exhaust passages are aligned along the height direction. Further, the exhaust passages include the exhaust/inlet ports on both side ends along the height direction.

In the mass spectrometer of this embodiment, the case having a height smaller than a width and having a depth smaller than the height centrally have: heavy loads including a vacuum chamber; a vacuum pump evacuating air from this vacuum chamber; a sample insertion unit which provides an ionized sample to the vacuum chamber; an ion detection unit which is connected to the vacuum chamber; and a battery, wherein circuit board storage units for separately storing plural circuit boards are formed on both sides along a width direction, both ends of the case including the pair of circuit board storage units have a pair of projecting units which project in one height direction and are connected with a bar-like handle unit, and widest surface of the case has an operation unit including an injection port for injecting a sample into the sample insertion unit.

In this case, the circuit board storage unit is an exhaustive passage along which the plural circuit boards are aligned along the height direction, and includes an exhaust/inlet port on both ends along the height direction. Further, the operation unit is covered with the opening/closing cover, and includes a driving status display unit and an examination start button.

What is claimed is:

1. A mass spectrometer, comprising:
    a case;
    a first circuit board storage unit; and
    a second circuit board storage unit,
    wherein the first circuit board storage unit is disposed on one side of the case and the second circuit board storage unit is disposed on an opposite side of the case,
    each of the first circuit board storage unit and the second circuit board storage unit store a plurality of circuit boards,
    the case centrally having heavy loads disposed inside the case and between the first circuit board storage unit and the second circuit board storage unit,
    the case centrally having heavy loads including:
        a vacuum chamber;
        a vacuum pump which evacuates the vacuum chamber;
        a sample introduction unit which introduces and evaporates a sample to be measured;
        an ionization unit which ionizes the evaporated sample, and provides the ionized sample to the vacuum chamber; and
        an ion detection unit which is connected to the vacuum chamber.

2. The mass spectrometer according to claim 1, wherein
    the case has a height smaller than a width, and has a depth smaller than the height,
    the circuit board storage units are provided on both sides along a width direction of the case.

3. The mass spectrometer according to claim 2, wherein
    the plurality of circuit boards arranged in the circuit board storage units are aligned along a height direction.

4. The mass spectrometer according to claim 2, wherein
    each of the circuit board storage units includes exhaust/inlet ports on both ends in a height direction of the case.

5. The mass spectrometer according to claim 1, wherein
    an exhaust passage is formed in both of the circuit board storage units.

6. The mass spectrometer according to claim 5, wherein
    the case has a height smaller than a width, and has a depth smaller than the height; and
    the exhaust passage is provided along the width direction on both sides of the case.

7. The mass spectrometer according to claim 6, wherein the plurality of circuit boards arranged along the exhaust passage are aligned along a height direction.

8. The mass spectrometer according to claim 6, wherein the exhaust passage includes exhaust/inlet ports on both ends along the height direction of the case.

9. A mass spectrometer, comprising:
a case having a height smaller than a width, and having a depth smaller than the height;
wherein heavy loads are arranged centrally inside the case, the heavy loads include:
- a vacuum chamber,
- a vacuum pump which evacuates the vacuum chamber,
- a sample introduction unit which introduces a sample to be measured and evaporates the sample,
- an ionization unit which ionizes the evaporated sample and provides it to the vacuum chamber, and
- an ion detection unit which is connected to the vacuum chamber;

wherein a circuit board storage unit is formed on each side of the case in a width direction of the case, with a predetermined space therebetween, the circuit board storage units store a plurality of circuit boards wherein the circuit board storage units on each side of the case have projecting units which project toward a height direction, wherein a bar-like handle unit is formed to connect each of the projecting units, and wherein an operation unit includes an injection port for injecting a sample into the sample introduction unit, which is formed on a widest surface of the case.

10. The mass spectrometer according to claim 9, wherein each of the circuit board storage units includes an exhaust passage along which the plurality of circuit boards are aligned in the height direction, and includes an exhaust/inlet port on each of both ends along the height direction of the case.

11. The mass spectrometer according to claim 10, wherein the operation unit is covered with an opening/closing cover, and includes an operation status display unit and an examination start button.

12. The mass spectrometer according to claim 9, wherein a rotating body is included in the vacuum pump; and
the vacuum pump is arranged so that a rotating shaft of the rotating body inside the vacuum pump is in a horizontal direction or a vertical direction when the spectrometer is held up with holding the handle unit.

* * * * *